(12) United States Patent
Ghosh et al.

(10) Patent No.: US 11,317,517 B2
(45) Date of Patent: Apr. 26, 2022

(54) METHOD FOR CONNECTING SURFACE-MOUNT ELECTRONIC COMPONENTS TO A CIRCUIT BOARD

(71) Applicant: NCC NANO, LLC, Dallas, TX (US)

(72) Inventors: Rudresh Ghosh, Austin, TX (US); John Michael Passiak, Austin, TX (US); Vahid Akhavan Attar, Austin, TX (US); Kurt A. Schroder, Coupland, TX (US)

(73) Assignee: PulseForge Incorporated, Austin, TX (US)

( * ) Notice: Subject to any disclaimer, the term of this patent is extended or adjusted under 35 U.S.C. 154(b) by 207 days.

(21) Appl. No.: 16/900,467

(22) Filed: Jun. 12, 2020

(65) Prior Publication Data

US 2021/0392756 A1    Dec. 16, 2021

(51) Int. Cl.
| | |
|---|---|
| *B23K 1/00* | (2006.01) |
| *H05K 3/34* | (2006.01) |
| *H05K 13/04* | (2006.01) |
| *H05K 13/08* | (2006.01) |
| *B23K 1/005* | (2006.01) |

(52) U.S. Cl.
CPC .......... *H05K 3/3494* (2013.01); *B23K 1/005* (2013.01); *H05K 13/0465* (2013.01); *H05K 13/0817* (2018.08); *H05K 2203/0195* (2013.01); *H05K 2203/10* (2013.01)

(58) Field of Classification Search
CPC ............ H05K 3/3494; H05K 13/0465; H05K 13/0817; H05K 2203/0195; H05K 2203/10
See application file for complete search history.

(56) References Cited

U.S. PATENT DOCUMENTS

| 5,194,723 | A | * | 3/1993 | Cates | ................. | G01N 29/2418 |
|---|---|---|---|---|---|---|
| | | | | | | 219/121.62 |
| 5,204,517 | A | * | 4/1993 | Cates | ................... | B23K 26/705 |
| | | | | | | 134/1 |
| 5,413,275 | A | * | 5/1995 | Verguld | ................. | H05K 3/341 |
| | | | | | | 228/232 |
| 5,613,509 | A | * | 3/1997 | Kolb | ...................... | B44D 3/166 |
| | | | | | | 134/1 |
| 6,301,436 | B1 | * | 10/2001 | Hsiao | ..................... | B23K 1/018 |
| | | | | | | 228/264 |
| 2003/0019917 | A1 | * | 1/2003 | Furuno | .................. | B23K 1/206 |
| | | | | | | 228/246 |
| 2005/0103753 | A1 | * | 5/2005 | Watanabe | .............. | B23K 26/03 |
| | | | | | | 219/121.6 |

(Continued)

*Primary Examiner* — Kiley S Stoner
(74) *Attorney, Agent, or Firm* — Antony P. Ng (57) ABSTRACT

A method for connecting an electronic component to a circuit board is disclosed. Initially, a substrate and an electronic component having solder located between them are placed under a flashlamp. Multiple light pulses from the flashlamp are applied to the electronic component, substrate and solder until the solder reflows. During the application of the light pulses, the power of one of the light pulses from the flashlamp and the temperature of the electronic component are measured, the measured power is converted to radiant exposure, and in response to the measured temperature of the electronic component, the duty cycle of a next light pulse is adjusted adaptively according to the radiant exposure of the one light pulse.

20 Claims, 4 Drawing Sheets

(56) References Cited

U.S. PATENT DOCUMENTS

| | | | |
|---|---|---|---|
| 2009/0045245 A1* | 2/2009 | Yamamoto | B23K 1/018 |
| | | | 228/119 |
| 2009/0325116 A1* | 12/2009 | Matsuura | F27B 5/14 |
| | | | 432/198 |
| 2010/0006624 A1* | 1/2010 | Nakatsuka | B23K 1/0053 |
| | | | 228/111.5 |
| 2011/0240720 A1* | 10/2011 | Okada | H01L 24/799 |
| | | | 228/264 |
| 2019/0229085 A1* | 7/2019 | Arutinov | H01L 33/62 |

* cited by examiner

METHOD FOR CONNECTING SURFACE-MOUNT ELECTRONIC COMPONENTS TO A CIRCUIT BOARD

TECHNICAL FIELD

The present application relates to manufacturing methods in general, and, in particular, to a method for connecting surface-mount electronic components to a circuit board.

BACKGROUND

In general, electronic components can be connected to a circuit board via soldering. With the advent of surface mount technology and wave soldering, the need to solder electronic components manually onto a circuit board has been mostly eliminated from a production standpoint.

Surface mount technology necessitates the usage of solder paste having solder particles dispersed in an organic flux. Solder paste is selectively deposited on a circuit board followed by the placement of electronic components to be soldered, and the circuit board is then placed in a reflow oven fitted with a conveyer. The reflow oven reflows solder paste by heating it to activate the flux in the solder paste to clean the surfaces and melt the solder. The molten solder wets the surfaces and solidifies, thereby making a good electrical/mechanical connection between the electronic components and the circuit board.

However, there are some limitations to the reflow process. Since the entire assembly must go through the reflow oven, the entire circuit board and electronic components must be able to withstand the high temperature that is required to reflow the solder paste. For standard SAC-305 solder paste, the temperature is about 217° C. Another limitation of the reflow process is the lengthy time needed to process the solder paste to allow for the solder to reflow. Typically, it will take about 10 minutes as the thermal profile of the reflow oven is being carefully controlled and may include multiple predetermined steps of ramp up, soak, and ramp down temperature zones.

One solution for the high temperature requirement of the reflow process is to use solder paste that has a lower reflow temperature. At present, such solder pastes tend to have poor thermal and mechanical performance as compared to standard SAC-compliant solder pastes. Another solution for the high temperature requirement of the reflow process is to use electrically-conducting adhesives instead of solder paste. This allows near room temperature (25° C.) processing. As with the low-temperature solder pastes, the mechanical and electrical robustness of the joints is sacrificed.

With the reflow process, energy is transferred to electronic components, circuit board, and solder paste via convection, which presents another problem. The shear from the air in the reflow oven may cause electronic components to blow off the circuit board or become misaligned before they are soldered to the circuit board. This becomes a larger issue when the electronic components are very small as their aerodynamic cross-section to weight ratio is larger.

One alternative approach to the reflow process is to use a laser. With this approach, a solid-state laser can be directed on solder joints or electronic components to heat them and reflow the solder without heating the entire circuit board. The laser process is able to deliver a precise amount of power and energy to solder joints to reflow the solder paste in about one second. However, the laser process is inherently serial in nature, thus, the total amount of time needed for a circuit board having many solder joints will increase as the number of solder joints increases. In addition, the laser process requires registration to solder joints. In other words, it requires either a machine vision system and/or careful alignment and programming of the location of each joint to be soldered. Furthermore, the laser process can suffer from beam non-uniformities that may cause electronic components to be unevenly heated. This results in poor solder joints, damage to other parts of the circuit board, or "tombstoning" of electronic components.

Another alternative approach to the reflow process is to use a continuous light source such as a tungsten filament or tungsten halogen-based lamp. One problem with this approach is that it takes a finite amount of time, approximately one second, to turn on or turn off the light source. Unlike the laser process, a continuous light source cannot be modulated on the timescale of the thermal equilibration time of the solder paste deposition, which is usually less than about 100 milliseconds. This limitation inhibits the ability of precisely controlling the power and energy profile that is deposited to the material being processed. This is especially the case for an exposure in which the target material being processed is stationary during exposure. In the case when the target material is being conveyed, there is a similar problem in that the ideal exposure is generally linked to the conveyance rate. Adjusting either the conveyance rate or the exposure level cannot be done fast enough to control the output of the machine in order to guarantee a uniform thermal treatment of the material being processed.

Consequently, it would be desirable to provide an improved method for electrically and mechanically connecting surface-mount electronic components to a circuit board.

SUMMARY OF THE INVENTION

In accordance with one embodiment, a substrate and an electronic component having solder located between them are placed under a flashlamp. Multiple light pulses from the flashlamp are applied to the electronic component, substrate and solder until the solder reflows. During the application of the light pulses, the power of one of the light pulses from the flashlamp and the temperature of the electronic component are measured, the measured power is converted to radiant exposure, and in response to the measured temperature of the electronic component, the duty cycle of a next light pulse is adjusted adaptively according to the radiant exposure of the one light pulse.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
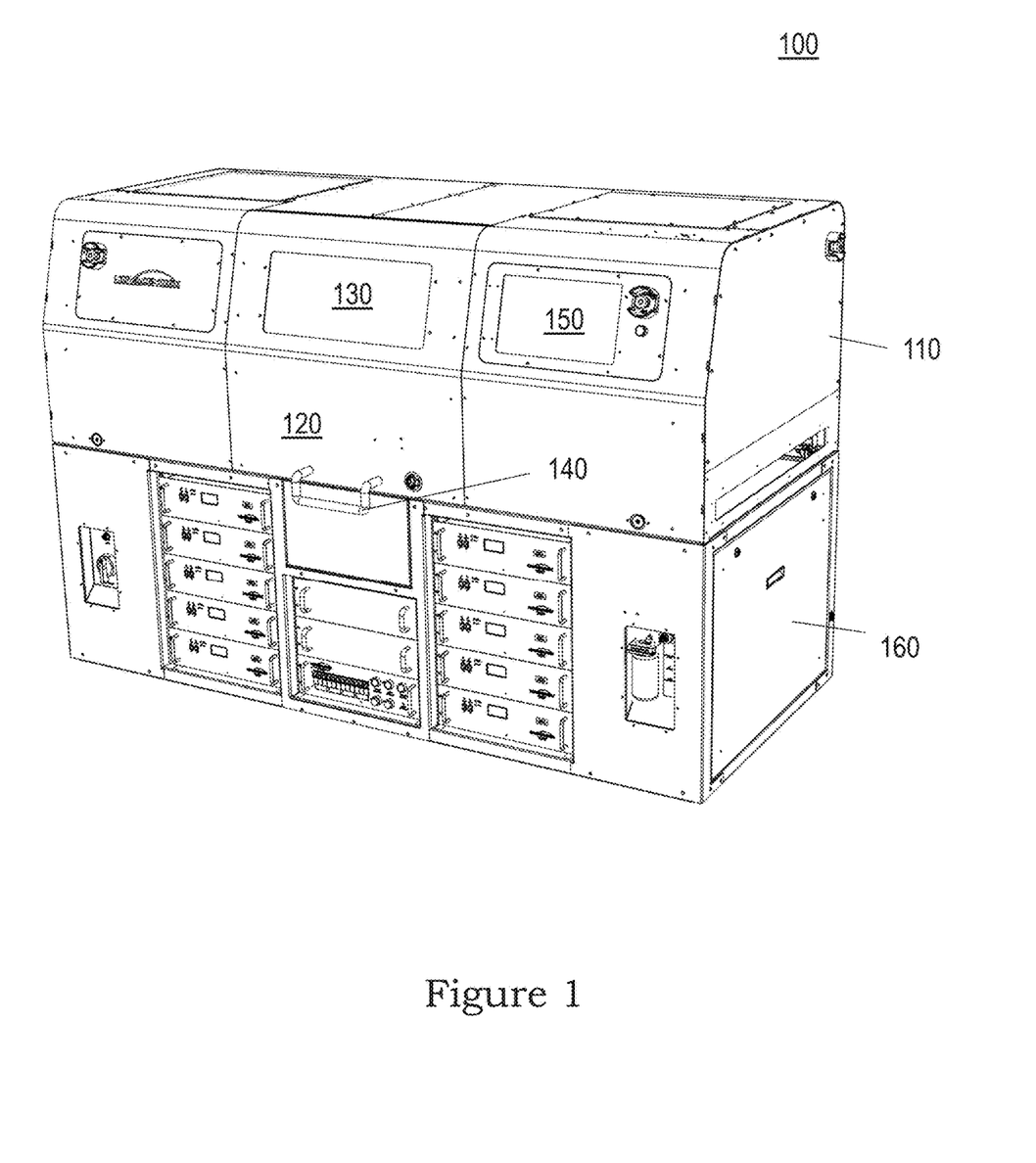
FIG. 1 is an isometric view of a system for thermally processing solder paste to connect surface-mount electronic components to a circuit board, according to one embodiment.

Referring now to the drawings and in particular to FIG. 1, there is depicted an isometric view of a system for thermally processing solder paste to connect electronic components to a circuit board, according to one embodiment. As shown, a system 100 includes an enclosure 110 resting on an equipment rack 160. Enclosure 110 includes a hatch door 120 that can be lifted open via a handle 140. A semi-transparent window 130 is provided in hatch door 120 to allow a user to observe any processing occurring within enclosure 110. At least one flashlamp (not shown) is positioned within enclosure 110 to enable thermal processing. Users can enter and receive information into and from system 100 via a touchscreen 150.

Enclosure 110 may include an environmentally controlled chamber (not shown) that can be filled with an inert gas, e.g., nitrogen, or a reactive gas, e.g., formic acid, or vacuum, in which thermal processing can be performed on electronic components. In addition, enclosure 110 may include a conveyor (not shown) for transporting electronic components during thermal processing.

Various mechanical equipment and electrical components configured for operating system 100 can be contained within equipment rack 160.

Figure 2:
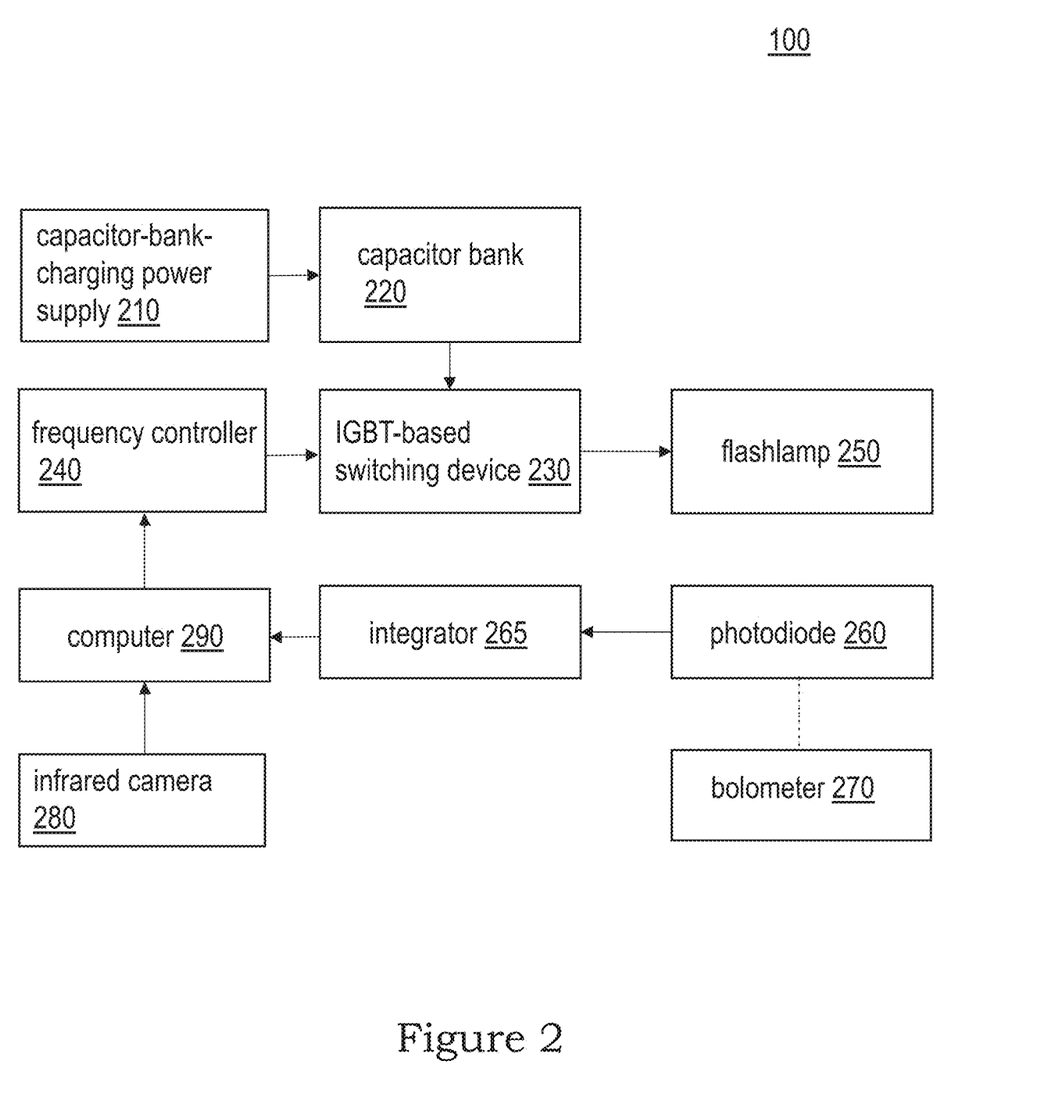
FIG. 2 is a detailed block diagram of the system from FIG. 1, according to one embodiment.

With reference now to FIG. 2, there is depicted a block diagram of system 100, according to one embodiment. As shown, system 100 includes capacitor-bank-charging power supply 210, capacitor bank 220, an insulated gate barrier transistor (IGBT)-based switching device 230, a frequency controller 240, a flashlamp 250, a photodiode 260, an integrator 265, a bolometer 270, an infrared (IR) camera 280, and a computer 290. Computer 290 includes a processor and various storage devices that are well-known to those skilled in the art. The capacitors in capacitor bank 220 are, for example, electrolytic capacitors. Some of the above-mentioned components can be placed within equipment rack 160 (from FIG. 1).

Capacitor bank 220 can be charged by capacitor-bank-charging power supply 210. Charges from capacitor bank 220 are then discharged into flashlamp 250 via IGBT-based switching device 230 while IGBT-based switching device 230 is being switched on-and-off repeatedly by frequency controller 240 during the discharge. Frequency controller 240 controls the gating of IGBT-based switching device 230 that, in turn, controls the switching frequency of the discharge. The repeated on-and-off switching of IGBT-based switching device 230 is intended to modulate the current flow from capacitor bank 220 to flashlamp 250, which in turn switches flashlamp 250 on and off. In other words, the frequency or pulse length of light pulses emitted by flashlamp 250 is dictated by frequency controller 240.

Photodiode 260 needs to be calibrated before system 100 can be deployed to perform thermal processing. Photodiode 260 can be calibrated by using bolometer 270 that is preferably National Institute of Standards and Technology (NIST) traceable. During calibration, both photodiode 260 and bolometer 270 are exposed to a single light pulse emitted from flashlamp 250. Bolometer 270 measures the radiant exposure or energy per area (in unit $J/cm^2$) of the single light pulse, and photodiode 260 measures the instantaneous power (in unit W) of the same light pulse. The instantaneous power signals from photodiode 260 are then integrated by integrator 265 to yield a radiant exposure value of the same single light pulse, and the radiant exposure measurement from bolometer 270 is divided by this radiant exposure value from integrator 265 to generate a calibration factor as follows:

$$\text{calibration factor} = \frac{\text{radiant exposure measurement}}{\text{radiant exposure value}}$$

After calibration, the photodiode 260/integrator 265 combination can be utilized to provide radiant exposure information of each light pulse emitted from flashlamp 250. Basically, the radiant exposure information of a light pulse emitted from flashlamp 250 can be calculated by multiplying the calibration factor obtained during calibration with the output value of integrator 265 (which is the radiant exposure value of the light pulse emitted from flashlamp 250 formed by integrating the instantaneous power signals of the light pulse emitted from flashlamp 250 measured by photodiode 260).

Even though photodiodes are technically designed for measuring instantaneous power instead of radiant exposure, the reasons for using photodiodes, such as photodiode 260, to obtain radiant exposure information of the light pulses from flashlamp 250 in system 100 is because photodiodes are reliable and small enough to be placed adjacent to flashlamp 250 or to sample light from a small optical fiber that does not obscure light pulses. Having a relatively high sample rate of over 1 MHz, photodiodes are also inexpensive.

However, in order to employ a photodiode to obtain radiant exposure information of light pulses from a flashlamp, the photodiode has to be calibrated, as mentioned above. One reason for the calibration can be found in FIG. 4 that depicts the emission intensities from two flashlamp discharges of identical pulse length as a function of wavelength for two different capacitor bank voltages, namely, 300 V and 400 V. The light pulses emitted by the flashlamp are broadband—from ~250 nm to ~1,700 nm. The integral of the intensity over the emission range is proportional to the power emitted in $W/cm^2$. As the voltage increases, the emission in all bands increases, but the emission in the shorter wavelengths increases more rapidly than that of longer wavelengths. In other words, as the capacitor bank discharge voltage changes, the spectral emission distribution changes as well. A photodiode, unfortunately, has a sensitivity that varies over wavelength. Thus, the direct output of the photodiode cannot give a quantitative power output from the flashlamp's emission as the magnitude of the signal is a convolution of the sensitivity of the photodiode and the emission intensity, both of which vary over wavelength.

Figure 4:
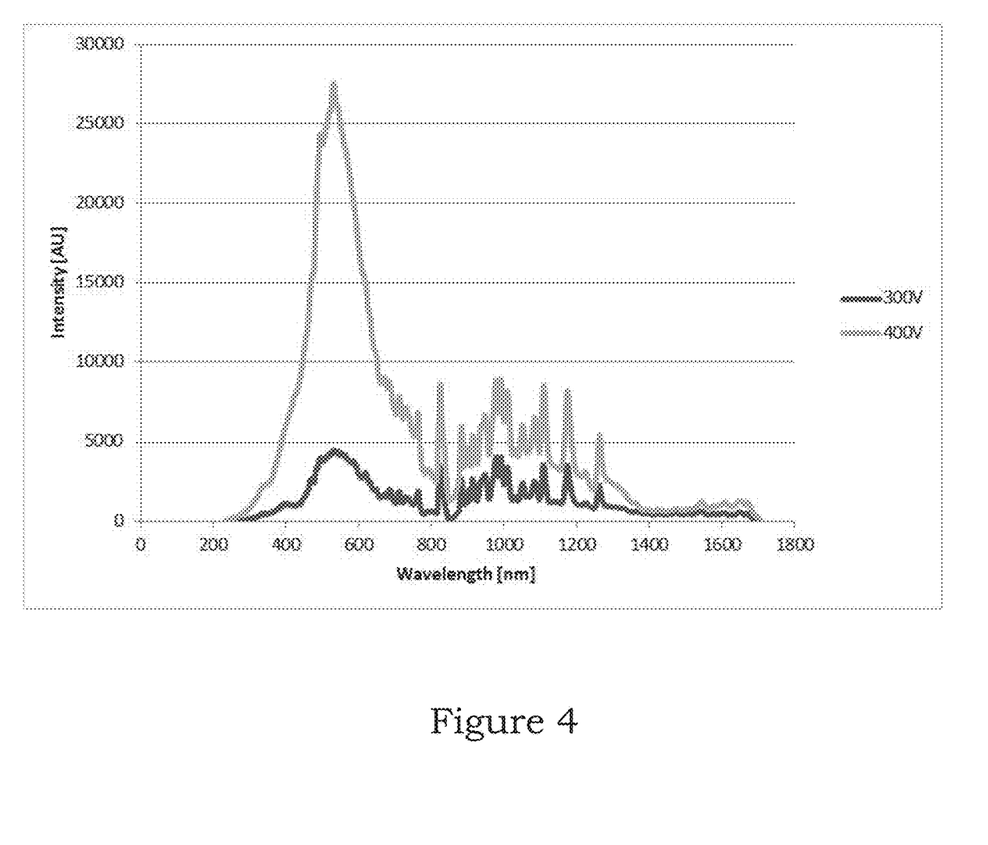
FIG. 4 graphically shows the intensity of the flashlamp emission versus wavelength at two difference capacitor bank firing voltages.

The above-mentioned calibration process is designed to remedy the inadequacies of a photodiode. By using a bolometer, such as bolometer 270, and an integrator, such as integrator 265, the photodiode can be calibrated by integrating the power signals from a single pulse of light emitted from a flashlamp. A bolometer, in contrast to a photodiode, can measure the radiant exposure (total energy) emitted by a light pulse emitted from the flashlamp. Principally, this is due to the fact that the radiation sensing element has a flat sensitivity over the entire emission spectrum. Thus, a shift in the emission spectrum of the flashlamp does not affect the ability of the bolometer to measure all the light impinging upon it. But the radiant exposure of light pulses from the flashlamp cannot be measured by just using a bolometer either. This is because the time response of a bolometer is very poor. A typical time resolution of a bolometer may be about 1 Hz versus over 1 MHz of a photodiode. In addition, a bolometer is usually quite large and thus it will obfuscate a portion of the light from a flashlamp.

Figure 3:
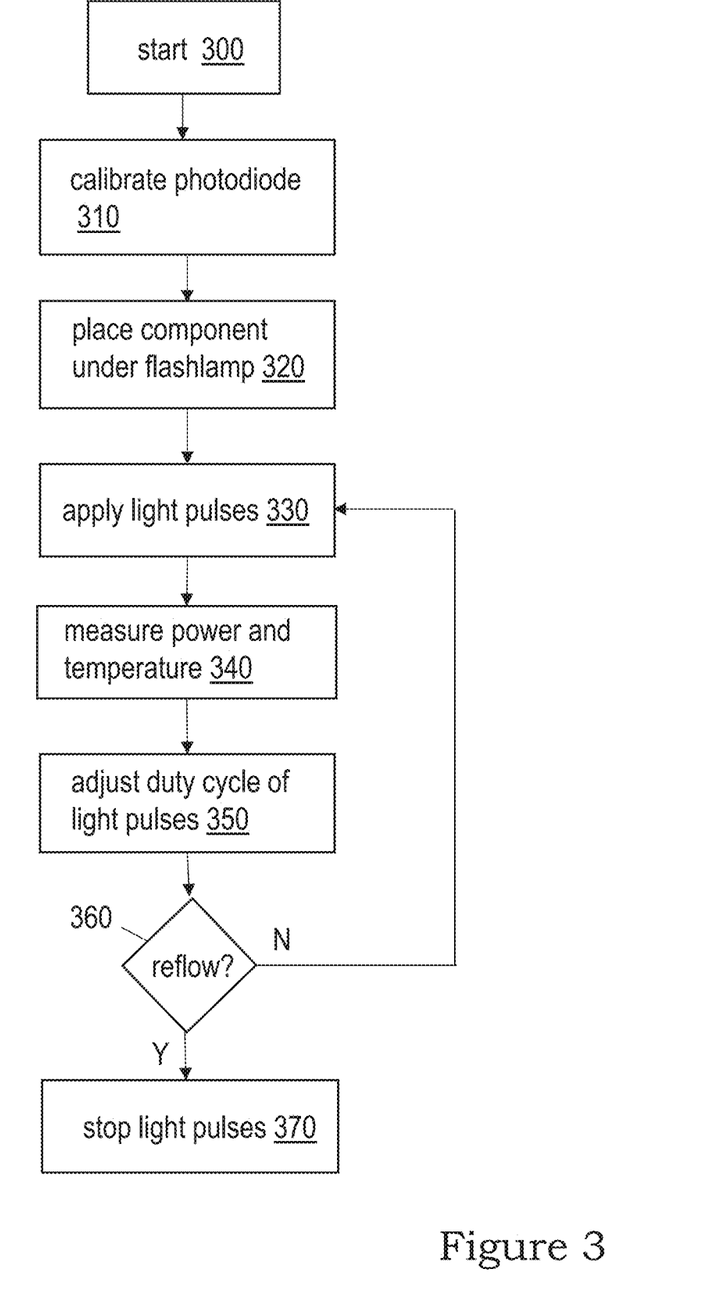
FIG. 3 is a flow diagram of a method for connecting surface-mount electronic components to a circuit board.

Referring now to FIG. 3, there is illustrated a flow diagram of a method for connecting an electronic component to a circuit board, according to one embodiment. Starting at 300, a photodiode, such as photodiode 260 from FIG. 2, is initially calibrated by using a bolometer, such as bolometer 270 from FIG. 2, as shown in block 310. The calibration is performed by using a single light pulse from a flashlamp, such as flashlamp 250 from FIG. 2, in order to obtain a calibration factor, as mentioned above. After calibration, the photodiode is ready to be employed for measuring the radiant power of each light pulse emitted by the flashlamp.

Next, a circuit board, or a substrate, having some solder paste located between an electronic component and the circuit board is then placed under the flashlamp, as depicted in block 320. The solder paste can be any solder paste, including SAC-compliant solder paste or a thick film material having a thickness greater than 50 microns. The substrate can be a circuit board having standard circuit board material, such as FR4, a thermoset, or a thermoplastic having a maximum working temperature of less than 200° C. Multiple light pulses from the flashlamp are then applied to the electronic component, solder paste, and the circuit board, as shown in block 330.

During the application of light pulses (i.e., thermal processing operation), the radiant exposure value of each light pulse from the flashlamp is obtained by the calibrated photodiode and an integrator, such as integrator 265 from FIG. 2, and the temperature of the electronic component that is being soldered onto the circuit board is obtained by an IR camera, such as IR camera 280 from FIG. 2, as depicted in block 340.

In conjunction, the IR camera monitors the circuit board in order to measure the temperature of the electronic component and/or temperature distribution across the circuit board during the application of light pulses. Since the emission from the flashlamp is in the range of 250 nm to approximately 1,700 nm, and the IR camera "sees" principally in the 10 micron portion of the electromagnetic spectrum, there is no interference from the flashlamp on the infrared emission by the circuit board. Thus, the IR camera can "see" the heating across the circuit board during flashlamp processing.

The power information measured by the photodiode is converted into a radiant exposure value using the calibration factor obtained during the calibration process (i.e., block 310). Based upon the radiant exposure value of a light pulse and the measured temperature information of the electronic component, the frequency and/or duty cycle of a subsequent light pulse can be adaptively adjusted before the application of the subsequent light pulse, as shown in block 350.

For example, a computer, such as computer 290 from FIG. 2, can instruct a frequency controller, such as frequency controller 240 from FIG. 2, to adjust the duty cycle of an upcoming light pulse to be emitted by the flashlamp, based on the radiant exposure value and the measured temperature information, in order to track a desired temperature profile of the electronic component on the circuit board. A temperature profile of an electronic component on a circuit board may look like:

| time unit/s | temp/° C. |
|---|---|
| 0 | 25 |
| 1 | 240 |
| 5 | 240 |
| 6 | 180 |

Next, a determination is made whether or not the solder paste has reflowed, as depicted in block 360. If the solder paste has not reflowed, the process returns to block 330; but if the solder paste has reflowed, the application of light pulses can stop, as shown in block 370. The steps shown in blocks 330, 340, 350 and 360 are performed in an iterative manner. After the solder paste has reflowed, it will then cool down to solidify. At that point, the electronic component is connected to the circuit board via the solidified solder.

For a given firing voltage from a capacitor bank, such as capacitor bank 220 from FIG. 2, the integrated photodiode signal is proportional to the radiant exposure of each pulse over a long range of pulse length and pulse frequency. There are two requirements to this technique. The first requirement is that in order to correlate the energy emitted from the flashlamp on a pulse-by-pulse basis using the integrated photodiode signal over a range of firing frequencies, a capacitor-bank-charging power supply, such as capacitor-bank-charging power supply 210 from FIG. 2, must be large enough to completely recharge the capacitor bank, such as capacitor bank 220 from FIG. 2, before each light pulse is emitted. The second requirement is that in order to correlate the integrated power signals from the photodiode to the bolometer over a range of pulse lengths, the capacitor bank's voltage needs to have minimal droop during the discharge. By doing so, the peak spectral output intensity is ensured to remain relatively constant during the discharge. Thus, large capacitance is preferable, and the size of the capacitor bank is dependent on the accuracy needed for the power measurement. Preferably, less than 5% of the stored energy of the capacitor bank is discharged in each pulse.

The technique described in the present disclosure allows a traceable measurement of the radiant energy being emitted by the flashlamp. Thus, for a firing rate of 10 Hz, the average power (or cumulative energy) emitted can be known at a data rate of 10 Hz. At a firing rate of 50 Hz, the average power emitted can be known at a data rate of 50 Hz. Furthermore, the firing rate and/or duty cycle of the flashlamp can be electronically adjusted by the frequency controller, during the processing interval, which is greater than 1 second, to generate a tailored power profile. By varying the pulse rate and/or duty cycle, the amount of energy delivered over time will be varied.

The heating profile for an electronic component can be preprogrammed or can be modified during processing, as determined by a temperature sensor trained on a circuit board (or material) as it is being processed. On the latter, knowing the emission energy from the flashlamp is only half the problem. The entire circuit board is being illuminated, including the circuit board, metal traces, electronic components, and solder paste. As each item has a different absorptivity of the flashlamp emission, a different thermal mass, and a different thermal communication to surrounding components, they each are heated to a different temperature from a uniform emission source. Thus, in addition to knowing the emission of the flashlamp, it is also important to know the heating response of the different electronic components on a circuit board due to the emission.

Multiple thermal processes can be performed by system 100 over the processing time, which is 1 to 10 seconds, such as activation of the flux, evaporation of the flux, heating of the solder particles to their melting point, melting of the solder particles, and reflow of the solder. As all of the above-mentioned processing steps are being performed over a very short period of time, it is necessary to be able to deliver a known amount of power to a circuit board and to vary that power during processing.

System 100 is also capable of emitting the same average power over a period of time with a varying spectral output. This allows for better discrimination between what is heated on a circuit board by the beam and what is not as different parts or electronic components on a circuit board have different absorptivity across flashlamp 250's emission spectrum. Specifically, when capacitor bank 220's firing voltage is higher, the overall power across the entire spectrum is higher than it is for a lower voltage, but the proportion of shorter wavelength light is higher (see FIG. 4). In other words, when capacitor bank 220's firing voltage is lower, the spectral emission in all bands is lower, but the percentage of longer wavelength light is higher. Still, the same amount of radiant power delivered over many pulses can be a predetermined level independent of the firing voltage as the duty cycle of the flashlamp can be adjusted. This can be accomplished by varying the pulse length or/and pulse frequency. More specifically, if a portion of the circuit board that is desired to be heated is more absorptive in the longer wavelength of the emission spectrum, one can have longer pulse length or high frequency pulsing of flashlamp 250 and deposit the same emission power profile as a higher voltage, shorter pulse length, shorter frequency condition. Additionally, an optical filter of the emission may be utilized to allow for even more discrimination. For system 100, the control parameters include capacitor bank voltage, pulse length, pulse frequency, and total pulse train duration.

System 100 may include one or more lamp housings, each of which contains at least one flashlamp such as flashlamp 250. This allows thermal processing of solder on a circuit board as well as a thick film on a substrate by irradiation from the top (e.g., irradiation from the thick film side), irradiation from the bottom (e.g., irradiation from the substrate side), or both. The top and bottom flashlamps may be independently synchronized in their firing or they may receive the same firing trigger signal.

The conveyor within system 100 includes two modes of operation, namely, stationary mode and synchronized mode. With stationary mode, a circuit board is not being conveyed during processing and the exposure profile is controlled by electronically by frequency controller 240. In this case, the pulse frequency, and therefore the power emitted by flashlamp 250 can be changed over the time of processing. Alternatively, the pulse length of each pulse may be changed during processing to adjust the energy delivered per pulse by flashlamp 250 to the circuit board. In synchronized mode, the pulse rate of light pulses from flashlamp 250 may be synchronized with the conveyance rate of the conveyor to yield the same radiant exposure, that is, the total energy delivered in $J/cm^2$, to the circuit board being conveyed. When this is done, the radiant exposure delivered can be independent of the conveyance rate.

During synchronized mode, flashlamp housing, which holds flashlamp 250 and has a reflector to direct the light from flashlamp 250 towards a circuit board may be tilted upward, e.g., rotated towards the conveyance direction or opposing to the conveyance direction as the circuit board is being conveyed past flashlamp housing. In the case when flashlamp housing is parallel to the circuit board being conveyed, the exposure is very uniform approximately 2% to 3% variation across the exposure area. When the flashlamp housing is further from the circuit board, the light pulses are less intense. Thus, tilting the head of flashlamp 250 allows the exposure to be ramped up in intensity or ramped down in intensity as the circuit board is conveyed past the head of flashlamp 250. This feature allows for more control of the gas that is generated from processing the solder paste so that the electronic components can be successfully attached without failure.

As has been described, the present invention provides an improved method for electrically and mechanically connecting surface-mount electronic components to a circuit board.

Although designed for processing solder paste, system 100 is appropriate for processing any thick film greater than 50 microns as the same issues come up such as the need to apply a precise and large amount of energy ($>30$ $J/cm^2$) delivered over a precise power profile over a period of 1 to 10 seconds with multiple pulses of light. Additionally, the disclosed method enables the ability to attach electronic components that are thermally fragile to a circuit board by reducing the total thermal budget over the prior art. The reduced thermal budget additionally enables the use of processing thick films on thermally fragile substrates, with maximum operating temperatures of less than 200° C. Examples include thermoplastics such as PVC, TPU, polyester, PET, PEN, paper, etc.

While the invention has been particularly shown and described with reference to a preferred embodiment, it will be understood by those skilled in the art that various changes in form and detail may be made therein without departing from the spirit and scope of the invention.

What is claimed is:

1. A method for connecting electronic components to a substrate, said method comprising:
    placing a substrate having solder located between an electronic component and said substrate under a flashlamp;
    applying a plurality of light pulses from said flashlamp to said electronic component, said solder, and said substrate until said solder reflows; and
    during said applying of light pulses,
        measuring a power of one of said light pulses from said flashlamp and converting said measured power to a radiant exposure value;
        measuring a temperature of said electronic component being soldered onto said substrate; and
        in response to said measured temperature of said electronic component, adaptively adjusting a duty cycle of a next light pulse according to said radiant exposure value of said one light pulses.

2. The method of claim 1, wherein said measuring of a power is performed by using a photodiode.

3. The method of claim 2, further comprising calibrating said photodiode to generate calibration factor.

4. The method of claim 3, wherein said converting further include converting said measured power to said radiant exposure value using said calibration factor.

5. The method of claim 1, wherein said measuring of a temperature is performed by using an infrared (IR) camera.

6. The method of claim 1, wherein said adjusting a duty cycle is performed by changing a frequency of said light pulses.

7. The method of claim 1, wherein said adjusting a duty cycle is performed by changing a pulse length of said light pulses.

8. The method of claim 1, wherein said substrate is a circuit board.

9. The method of claim 1, wherein said substrate is a thermoplastic having a maximum working temperature of less than 200° C.

10. The method of claim 1, wherein said solder is a thick film material having a thickness greater than 50 microns.

11. The method of claim 1, further comprising transporting said electronic component during said application of said light pulses.

12. The method of claim 11, further comprising synchronizing the speed of said transporting of said electronic component with a frequency of said light pulses.

13. The method of claim 1, further comprising placing said electronic component in an environmentally controlled chamber before said application of said light pulses.

14. A system for connecting electronic components to a substrate, said system comprising:
- a capacitor bank;
- a capacitor-bank-charging power supply for charging said capacitor bank;
- an IGBT-based switching device;
- a frequency controller;
- a flashlamp for emitting light pulses, wherein said flashlamp receives charges from said capacitor bank via said IGBT-based switching device while said IGBT-based switching device is being switched on-and-off repeatedly by said frequency controller in order to modulate the flow of said charge from said capacitor bank to said flashlamp, which in turn switches said flashlamp on and off;
- a photodiode for measuring a power of a light pulse from said flashlamp;
- an infrared camera for measuring a temperature of an electronic component being soldered onto a substrate; and
- a processor, in response to said measured temperature of said electronic component, adaptively adjusting a duty cycle of a next light pulse via said frequency controller according to a radiant exposure derived from said measured power of said light pulse from said flashlamp.

15. The system of claim 14, further comprising a bolometer for calibrating said photodiode.

16. The system of claim 14, wherein said capacitor bank includes a plurality of electrolytic capacitors.

17. The system of claim 14, wherein said processor adjusts said duty cycle of said light pulses by changing a frequency of said light pulses via said frequency controller.

18. The system of claim 14, wherein said processor adjusts said duty cycle of said light pulse by changing a pulse length of said light pulses via said frequency controller.

19. The system of claim 14, further comprising a conveyor for transporting an electronic component and a substrate that are being processed.

20. The system of claim 14, further comprising an environmentally controlled chamber for containing said electronic component during said application of said light pulses.

* * * * *